United States Patent
Yoo et al.

(10) Patent No.: US 10,345,698 B2
(45) Date of Patent: Jul. 9, 2019

(54) METHOD FOR FABRICATING SEMICONDUCTOR DEVICE

(71) Applicant: Samsung Electronics Co., Ltd., Suwon-si, Gyeonggi-do (KR)

(72) Inventors: Ji Beom Yoo, Seoul (KR); Sung Won Kwon, Suwon-si (KR); Dong Wook Shin, Changwon-si (KR); Mun Ja Kim, Suwon-si (KR); Jin Su Kim, Hwaseong-si (KR); Hwan Chul Jeon, Seoul (KR)

(73) Assignees: Samsung Electronics Co., Ltd., Gyeonggi-do (KR); Research & Business Foundation Sungyunkwan University, Gyeonggi-do (KR)

( * ) Notice: Subject to any disclaimer, the term of this patent is extended or adjusted under 35 U.S.C. 154(b) by 69 days.

(21) Appl. No.: 15/606,170

(22) Filed: May 26, 2017

(65) Prior Publication Data
US 2018/0136554 A1    May 17, 2018

(30) Foreign Application Priority Data
Nov. 16, 2016    (KR) .......................... 10-2016-0152779

(51) Int. Cl.
*G03F 1/62*    (2012.01)
*G03F 1/80*    (2012.01)
(Continued)

(52) U.S. Cl.
CPC .................. *G03F 1/62* (2013.01); *G03F 1/22* (2013.01); *G03F 1/80* (2013.01); *G03F 7/2004* (2013.01); *H01L 21/0274* (2013.01)

(58) Field of Classification Search
None
See application file for complete search history.

(56) References Cited

U.S. PATENT DOCUMENTS 5,793,836 A    8/1998    Maldonado et al.
6,875,664 B1 *    4/2005    Huang ................ H01L 21/0276
                                                        438/299

(Continued)

FOREIGN PATENT DOCUMENTS

KR    20160034803 A    3/2016
KR    20160060200 A    5/2016
WO    WO-2016043536 A1    3/2016

OTHER PUBLICATIONS

Machine translation of WO 2016043536 (Mar. 2016).*
(Continued)

*Primary Examiner* — Martin J Angebranndt
(74) *Attorney, Agent, or Firm* — Harness, Dickey & Pierce, P.L.C.

(57) ABSTRACT

A method for fabricating a semiconductor device includes forming a pellicle including an amorphous carbon layer, attaching the pellicle onto a reticle, and forming a photoresist pattern by utilizing EUV light transmitted through the pellicle and reflected by the reticle. The forming the pellicle includes forming a first dielectric layer on a first side of the substrate, forming the amorphous carbon layer on the first dielectric layer, forming a second dielectric layer on a second side of the substrate opposite to the first side of the substrate, etching the second dielectric layer overlapping the first region of the substrate to form a mask pattern, and forming a support including the second region of the substrate and the remaining part of the first dielectric layer. The forming the support includes etching the first region of the substrate and the first dielectric layer on the first region.

20 Claims, 20 Drawing Sheets

(51) Int. Cl.
*H01L 21/027* (2006.01)
*G03F 1/22* (2012.01)
*G03F 7/20* (2006.01)

(56) References Cited

U.S. PATENT DOCUMENTS

| | | | |
|---|---|---|---|
| 7,901,846 B2 | 3/2011 | Kubota et al. | |
| 7,919,217 B2 | 4/2011 | Kubota et al. | |
| 8,110,493 B1* | 2/2012 | Subramonium | C23C 16/26 |
| | | | 438/618 |
| 9,360,749 B2 | 6/2016 | Lin et al. | |
| 9,768,024 B1* | 9/2017 | Tsai | H01L 21/02115 |
| 2014/0160455 A1 | 6/2014 | Yakunin et al. | |
| 2014/0370423 A1* | 12/2014 | Goldfarb | G03F 1/22 |
| | | | 430/5 |
| 2015/0309404 A1* | 10/2015 | Lin | G03F 1/62 |
| | | | 430/5 |
| 2016/0139500 A1* | 5/2016 | Kim | G03F 1/62 |
| | | | 430/5 |
| 2016/0147141 A1 | 5/2016 | Ono et al. | |
| 2017/0090279 A1* | 3/2017 | Ono | G03F 1/62 |
| 2017/0205705 A1* | 7/2017 | Ma | G03F 1/64 |
| 2018/0059534 A1* | 3/2018 | Tu | C23C 14/165 |
| 2018/0059535 A1* | 3/2018 | Tu | C23C 14/165 |
| 2018/0173092 A1* | 6/2018 | Lin | G03F 1/22 |

OTHER PUBLICATIONS

Li, et al. "Evolution of Graphene Growth on Ni and Cu by Carbon Isotope Labeling," Nano Letters, vol. 9, No. 12 pp. 4268-4272 (2009).

* cited by examiner

METHOD FOR FABRICATING SEMICONDUCTOR DEVICE

This application claims priority under 35 U.S.C. § 119 to Korean Patent Application No. 10-2016-0152779, filed on Nov. 16, 2016 in the Korean Intellectual Property Office, the disclosure of which is incorporated herein by reference in its entirety.

BACKGROUND

1. Technical Field

The present disclosure relates to a method for fabricating a semiconductor device.

2. Description of Related Art

Recently, for micro-fabrication of semiconductor element, a lithography process utilizing extreme ultraviolet light has been proposed. The lithography process is a process of reducing and projecting light or beam onto a silicon substrate through a mask on which a circuit pattern is drawn, and exposing a photoresist material to form an electronic circuit.

A minimum processing dimension of a circuit formed by an optical lithography process depends on the wavelength of the light source. Therefore, ways to shorten the wavelength of the light source in an optical lithography process for processing the semiconductor element are being studied. An extreme ultraviolet (EUV) light source is suitable as a next-generation lithography light source. Extreme ultraviolet light has a wavelength of about 1 to 100 nm. Since the extreme ultraviolet light has high absorptivity for many substances, a reflection type optical system is used instead of a transmission type optical system.

Generation of the light source plasma includes a light source plasma generation (Laser Produced Plasma, LPP) using a laser irradiation method, and a light source plasma generation (Discharge Produced Plasma, DPP) using a gas discharge method driven by the pulse power technique.

SUMMARY

Some example embodiments provide a pellicle having high EUV permeability and heat resistance and improved durability, using an amorphous carbon layer having a structure in which a $sp^2$ carbon bond structure and a $sp^3$ carbon bond structure are mixed with each other.

Some example embodiments provide a pellicle in which a substrate and an amorphous carbon layer are integrally formed to form a support by the substrate.

According to some example embodiments, a method for fabricating a semiconductor device includes forming a pellicle including an amorphous carbon layer, attaching the pellicle onto a reticle, and forming a photoresist pattern using extreme ultraviolet (EUV) light. The forming the photoresist pattern includes transmitting the EUV light through the pellicle and reflecting the EUV light using the reticle. The forming the pellicle includes forming a first dielectric layer on a first side of a substrate that includes a first region and second regions at both sides of the first region, forming the amorphous carbon layer on the first dielectric layer, forming a second dielectric layer on a second side of the substrate opposite to the first side of the substrate, etching the second dielectric layer overlapping the first region of the substrate to form a mask pattern, and etching the first region of the substrate and the first dielectric layer on the first region of the substrate using the mask pattern to form a support including the second region of the substrate and a remaining part of the first dielectric layer.

According to some example embodiments, a method for fabricating a semiconductor device includes forming a pellicle including an amorphous carbon layer, attaching the pellicle onto a reticle, and forming a first photoresist pattern by using extreme ultraviolet (EUV) light. The forming the first photoresist pattern includes transmitting the EUV light through the pellicle and reflecting the EUV light using the reticle. The forming the pellicle includes forming a first silicon oxide layer on a first side of a silicon substrate, forming the amorphous carbon layer on the first silicon oxide layer, forming a silicon nitride layer on a second side of the silicon substrate opposite to the first side of the silicon substrate, forming a second silicon oxide layer that covers the amorphous carbon layer, forming a second photoresist pattern on the silicon nitride layer, dry-etching the silicon nitride layer using the second photoresist pattern to form a mask pattern, and wet-etching the silicon substrate and the first silicon oxide layer using the mask pattern to form a support including a non-etched portion the silicon substrate and a non-etched portion the first silicon oxide layer, and removing the second silicon oxide layer.

According to some example embodiments of inventive concepts, a method for fabricating a pellicle includes forming a protective layer over an amorphous carbon layer of a stacked structure, and removing a first region of the substrate such that the amorphous carbon layer is connected to a remaining portion of the substrate that includes a second region of the substrate. The stacked structure includes the amorphous carbon layer on a first surface of a substrate and a first dielectric layer between the amorphous carbon layer and the substrate. In the stacked structure, the amorphous carbon layer covers the first region and the second region of the substrate.

BRIEF DESCRIPTION OF THE DRAWINGS

The above and other features of inventive concepts will become more apparent by describing in detail non-limit embodiments with reference to the attached drawings, in which.

DETAILED DESCRIPTION

Unless otherwise defined, all terms (including technical and scientific terms) used in this specification can be used as meanings capable of being commonly understood by those having ordinary skill in the technical field to which example embodiments belong. Also, commonly used and predefined terms are not interpreted ideally or unduly, unless specifically defined otherwise.

Hereinafter, referring to FIG. 1, formation of a photoresist pattern using a reticle and a pellicle used in a method for fabricating the semiconductor device according to some example embodiments will be illustrated.

Figure 1:
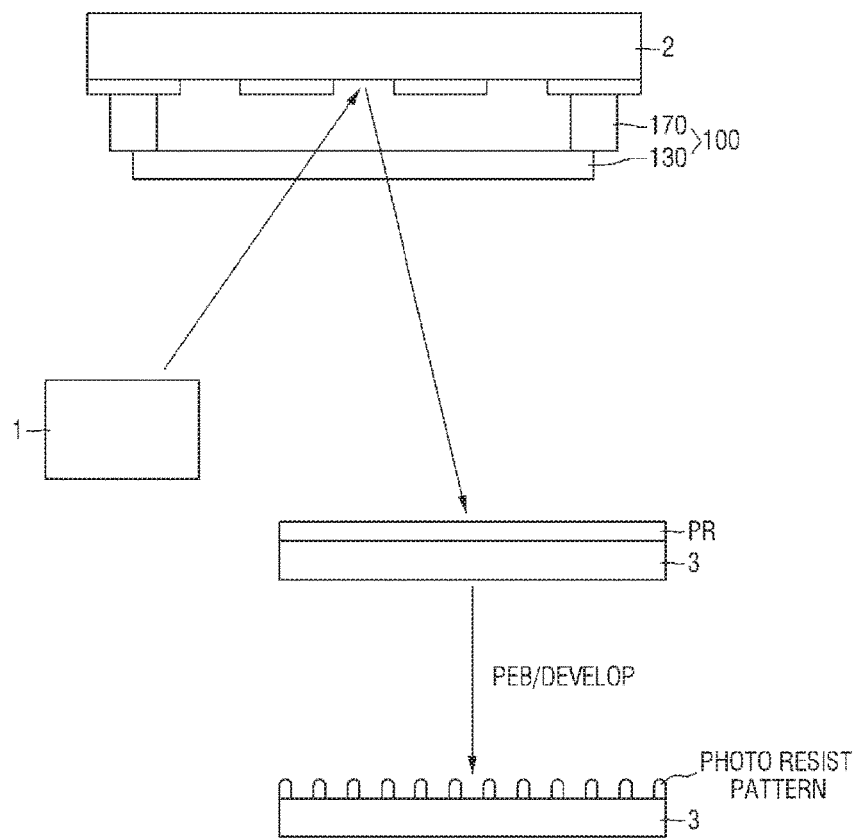
FIG. 1 is a diagram for explaining formation of a photoresist pattern, using a reticle and a pellicle used in a method for fabricating a semiconductor device according to some example embodiments.

FIG. 1 is a diagram for explaining the formation of the photoresist pattern using a reticle and a pellicle used in a method for fabricating a semiconductor device according to some example embodiments.

Referring to FIG. 1, a method for fabricating the semiconductor device according to some example embodiments may including performing a photolithography process of irradiating a reticle 2, to which a pellicle 100 is attached, with light generated by a light source 1, and forming a photoresist pattern on a wafer 3, using the light reflected by an optical pattern formed on the reticle 2. The structure including the pellicle 100 attached to the reticle 2 may be referred to as a mask assembly.

The light source 1 may generate extreme ultraviolet (EUV). For example, the light source 1 may generate the extreme ultraviolet having a wavelength of about 13.5 nm. The light may be generated using carbon plasma.

That is, the methods for fabricating the semiconductor device according to the present disclosure are related to a method for irradiating the reticle 2, to which the pellicle 100 is attached, with the extreme ultraviolet, using extreme ultraviolet irradiated from the source light 1, and exposing the photoresist PR on the wafer 3 using the extreme ultraviolet reflected by the optical pattern formed on the reticle 2. After the photoresist PR is exposed, a post-exposure bake PEB and developing process may be performed to form a photoresist pattern from the exposed photoresist PR.

The pellicle 100 may include an amorphous carbon layer 130 as a pellicle layer.

A entire composition of the pellicle layer may include carbon in a range 30 to 100 mol % and in a range of hydrogen 0 to 30 mol %. Further, a third component (e.g., an element selected from the group including of Si, B, N, O, Y, Zr, Nb and Mo) may be contained in an amount of 0 to 70 mol %, and the sum of the carbon, hydrogen and the third component in the composition of the amorphous carbon layer 130 may be, but not limited to, 98% or more.

In some example embodiments, a ratio (I(2D/I(G)) of the intensity I(G) of G (grapheme) band and the intensity I(2D) of the 2D (diamond) band in a Raman spectrum of the pellicle layer is 1 or less, or the intensity I(2D) of the 2D band and the intensity I(G) of the G band may be 0, respectively.

In the Raman spectrum of the silicon carbide layer, in some cases, it may not be possible to measure the intensity I(2D) of the 2D band and the intensity I(G) of the G band. That is, both the intensity I(2D) of the 2D band and the intensity I(G) of the G band may be 0. In this case, when the ratio (I(2D/I(G)) of the intensity I(G) of the G band and the intensity I(2D) of the 2D band is 1 or less, it means that graphene layer is not contained in the pellicle layer.

Here, the Raman spectrum may be observed using a Raman microscope. Observation with a Raman microscope may be performed as it will be described later.

The laser beam is made incident on a beam splitter, and the laser beam reflected by the beam splitter may be tightened to a beam diameter of about 1 μm by an objective lens for an optical microscope. Subsequently, the laser beam with an adjusted beam diameter may be irradiated in a direction perpendicular to the sample.

The Raman scattering light to the sample generated by laser beam irradiation may be collected by the objective lens. The collected Raman scattering light may be made incident on the spectroscope via a beam splitter or an aperture.

The measurement position of the Raman spectrum is not particularly limited, but it may measure a portion at which the layer has high smoothness and the layer thickness or the surface state on the laser irradiation side is uniform.

Since the Raman microscope generally uses X-Y electric stages, mapping measurements or multipoint measurements may be possible. Therefore, when there is a distribution in the carbon structure of the pellicle layer, multipoint measurement may be performed, and when there is no distribution in the carbon structure, only one point may be measured.

The wavelength of laser beam used for the Raman spectroscopy is not particularly limited. For example, the wavelength of the laser beam may be 1064 nm, 633 nm, 532 nm, 515 nm, 502 nm, 496 nm, 488 nm, 477 nm, 473 nm, 466 nm, 458 nm, 364 nm or 351 nm, as wavelength of the general laser beam.

Single layer graphene may be made up of aggregates of crystals which have a generally small size (usually about 100 to 1000 nm), and the Raman spectrum may be observed around 1590 $cm^{-1}$ and 2800 to 2600 $cm^{-1}$.

The spectrum around 1590 $cm^{-1}$ may be a spectrum which is defined as a G band and is commonly observed in the sp2 hybridized orbital. On the other hand, the spectrum observed at 2800 to 2600 $cm^{-1}$ may be defined as a 2D band.

The pellicle 100 may include a pellicle layer, that is, an amorphous carbon layer 130 capable of protecting the optical pattern formed on the surface of the reticle 2 from external contamination. Further, the pellicle 100 may include a support 170 which supports the amorphous carbon layer 130 and attaches the amorphous carbon layer 130 onto the reticle 2.

The amorphous carbon layer 130 may include a single layer. However, inventive concepts are not limited thereto. That is, in some example embodiments, the amorphous carbon layer 130 may be formed by laminating two or more layers.

The amorphous carbon layer 130 may be a layer in which the entire surface is supported by the support 170. However, inventive concepts are not limited thereto. That is, in some example embodiments, the amorphous carbon layer 130 may also be a layer that may hold and support the layer shape alone.

The amorphous carbon layer 130 may include a $sp^2$ carbon bond structure and a $sp^3$ carbon bond structure. For example, the sp carbon bond structure may be a graphene structure having a planar shape, and the $sp^3$ carbon bond structure may be a diamond structure having a three-dimensional shape.

The amorphous carbon layer 130 is a structure in which the $sp^2$ carbon bond structure and the $sp^3$ carbon bond structure are mixed with each other, and may contain 50% to 60% $sp^3$ carbon bond structure. However, inventive concepts are not limited thereto. That is, in some example embodiments, the mixing ratio of the $sp^3$ carbon bond structure may be different.

Generally, a high temperature of 1000° C. or more is used to deposit the graphene structure. However, in some example embodiments, the amorphous carbon layer 130 in which the $sp^2$ carbon bond structure and the $sp^3$ carbon bond structure are mixed with each other may be deposited at a temperature of 400° C. to 500° C. In this case, the amorphous carbon layer 130 may be deposited by any of the methods of plasma-enhanced chemical vapor deposition (PECVD), physical vapor deposition (PVD), atomic layer deposition (ALD), and thermal chemical vapor deposition (Thermal-CVD). However, inventive concepts are not limited thereto.

The extreme ultraviolet transmittance of the amorphous carbon layer 130, for example, may be about 65%. However, inventive concepts are not limited thereto.

The support 170 may be arranged at an edge of a disc of the amorphous carbon layer 130 and may also be arranged on the extreme ultraviolet incident surface side. However, inventive concepts are not limited thereto. That is, in some example embodiments, the amorphous carbon layer 130 may be buried in a gap of the mesh-like support 170.

The area of the support 170 with respect to the area of the inner region between the supports 170 may be 20% or less, for example 15% or less, further 10% or less. When the area of the support 170 exceeds 20%, the transmittance of extreme ultraviolet decreases and the irradiation efficiency of extreme ultraviolet may be reduced.

The shape of the support 170 is not particularly limited. For example, the shape of the support 170 may be one of a honeycomb shape, a square shape, a triangular shape and/or a polygonal shape. However, inventive concepts are not limited thereto.

In some example embodiments, a size of the repeating unit of the support 170 be as small as possible so that a shadow is not generated by the support 170 when exposing the photoresist.

Also, in order to increase the aperture ratio, in some example embodiments, the width of the support 170 be reduced within a range in which mechanical strength is maintained.

For example, the size of the polygonal repeating unit of the support 170 may be 10 to 500 μm, and the width of the support 170 may be in 0.1 to 50 μm. For example, the size of the polygonal repeating unit of the support 170 is 10 to 20 μm, and the width of the support 170 may be 0.1 to 20 μm. For example, the size of the polygonal repeating unit of the support 170 is 10 to 50 μm, and the width of the support 170 may be 0.1 to 1 μm.

The thickness of the support 170 may be in a range in which the mechanical strength is maintained. The amorphous carbon layer 130 may be irradiated with extreme ultraviolet at an inclination angle of about 6° and the extreme ultraviolet may be transmitted through the amorphous carbon layer 130. The extreme ultraviolet light transmitted through the amorphous carbon layer 130 may be irradiated in an optical pattern formed on the reticle 2, and the extreme ultraviolet light may be reflected by the optical pattern formed on the reticle 2 again at an inclination angle of about 6° and irradiated to the photoresist formed on the wafer 3.

Therefore, the thickness of the support 170 may be thin in order to reduce the area in which the extreme ultraviolet light is limited and/or blocked by the support 170. Therefore, the thickness of the support 170 may be 0.1 to 500 μm. Also, for example, the thickness of the support 170 may be 0.1 to 200 μm. For example, the thickness of the support 170 may be 0.1 to 20 μm.

Although it is not illustrated, an antioxidant layer may be formed on the surface of amorphous carbon layer 130. The antioxidant layer may limit and/or suppress the oxidation of the amorphous carbon layer 130 at the time of irradiation of extreme ultraviolet or at the time of storage of the pellicle. The antioxidant layer may be formed only on one side of the amorphous carbon layer 130, or may be formed on both sides of the amorphous carbon layer 130.

Hereinafter, an extreme ultraviolet light generating apparatus used in a method for fabricating a semiconductor device according to some example embodiments will be described with reference to FIG. 2.

Figure 2:
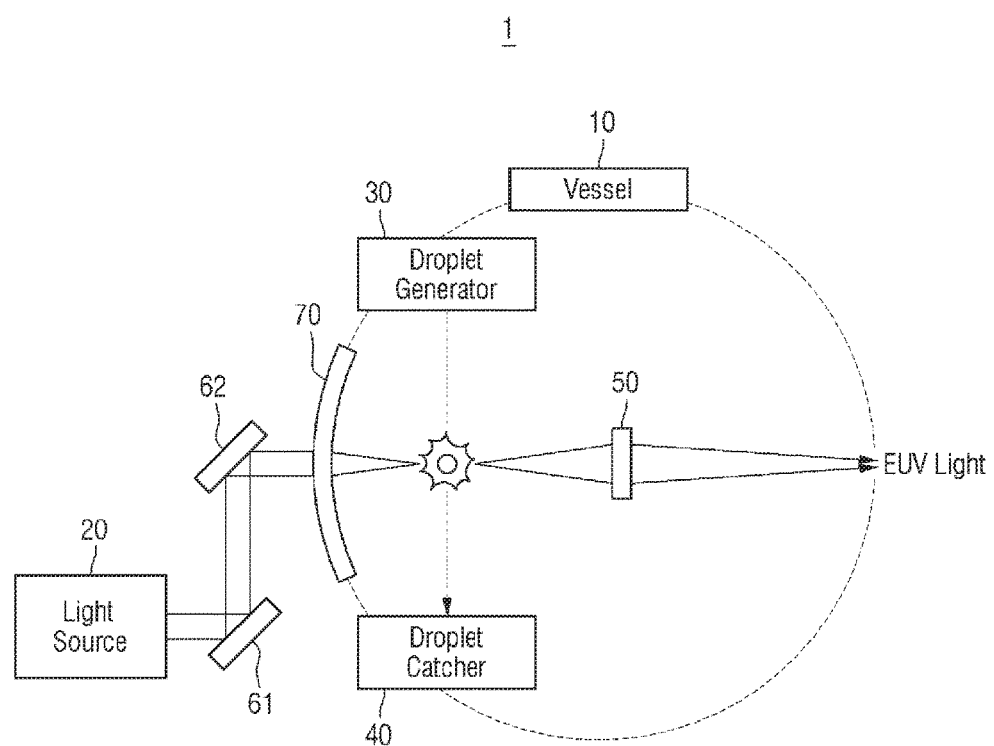
FIG. 2 is a diagram schematically illustrating an extreme ultraviolet light generating apparatus used in a method for fabricating the semiconductor device according to some example embodiments.

FIG. 2 is a diagram schematically illustrating an extreme ultraviolet light generating apparatus used in a method for fabricating the semiconductor device according to some example embodiments.

Referring to FIG. 2, the extreme ultraviolet light generating apparatus 1 generates extreme ultraviolet light, using the chemical reaction inside a vessel 10. A droplet generator 30 for providing the droplet, and a vertically spaced droplet catcher 40 for storing droplet may be disposed inside the vessel 10.

The droplet d may contain at least one of tin (Sn), lithium and/or xenon (Xe). For example, the droplet d may be a gas such as tin (Sn), lithium (Li) or xenon (Xe), or a cluster. A provided space of the droplet d be in a vacuum state. For example, the provided space of the droplet d may be about 1 mbar.

The light source 20 may provide a first light. That is, the first light provided by the light source 20 interacts with the droplet d and may generate extreme ultraviolet light. The first light provided by the light source 20 may be provided to the droplet d in the vessel 10 along reflectors 61 and 62.

The first light may be, for example, a $CO_2$ laser. For example, the first light may be a $CO_2$ laser which may have a high pulse of 40 kHz or higher and oscillates at the wavelength of 9.3 μm or 10.6 μm.

A collector mirror 70 may be disposed in one side of the vessel 10. A hole may be formed at the central portion of the collector mirror 70. A first light provided from the light source 20 may be provided into the vessel 10 through the hole.

The droplet d provided from the droplet generator 30 reacts with the first light provided into the vessel 10 and may generate extreme ultraviolet light.

The collector mirror 70 may collect and reflect the generated extreme ultraviolet light to concentrate the extreme ultraviolet light on the focusing lens 50, and may emit the extreme ultraviolet light to the outside of the vessel 10. Extreme ultraviolet light thus generated may be used in an exposure apparatus of a lithography process.

Hereinafter, a method for fabricating a semiconductor device according to some example embodiments will be described with reference to FIG. 3 to FIG. 13.

FIG. 3 to FIG. 13 are intermediate stage diagrams for explaining a method for fabricating a semiconductor device according to some example embodiments.

Figure 3:
FIG. 3 to FIG. 13 are intermediate stage diagrams for explaining a method for fabricating the semiconductor device according to some example embodiments.

Referring to FIG. 3, a substrate 110 may include a first region (R1 in FIG. 8) and a second region (R2 in FIG. 8) formed on both sides of the first region. In a subsequent process, the first region (R1 in FIG. 8) of the substrate 110 may be etched, and the second region (R2 in FIG. 8) of the substrate 110 is not etched and may be used as a part of the support (170 in FIG. 12).

A first dielectric layer 120 may be formed on the first side of the substrate 110. The substrate 110 may be, for example, a silicon substrate. However, inventive concepts are not limited thereto. That is, in some example embodiments, the substrate 110 may include other materials, e.g., silicon germanium, indium antimonide, lead tellurium compound, indium arsenide, indium phosphide, gallium arsenide or gallium antimonide.

The first dielectric layer 120 may be a silicon oxide layer containing silicon oxide. However, inventive concepts are not limited thereto. That is, in some example embodiments, the first dielectric layer 120 may contain any one of silicon nitride, metal, metal oxide and metal nitride. In a subsequent process, the first dielectric layer 120 may be used as an etching block layer.

Figure 4:
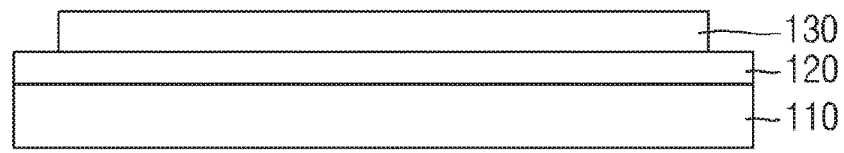

Referring to FIG. 4, an amorphous carbon layer 130 may be formed on the first dielectric layer 120. In this case, the amorphous carbon layer 130 may be formed on the first dielectric layer 120 using at least one of a PECVD, PVD, ALD and Thermal-CVD process. However, inventive concepts are not limited thereto.

As described above, the amorphous carbon layer 130 may have a structure in which the $sp^2$ carbon bond structure and the $sp^3$ carbon bond structure are mixed with each other. Due to such a structure, the amorphous carbon layer 130 may have higher extreme ultraviolet permeability and heat resistance, and improved durability, for example, compared with a single crystal silicon layer.

Figure 5:
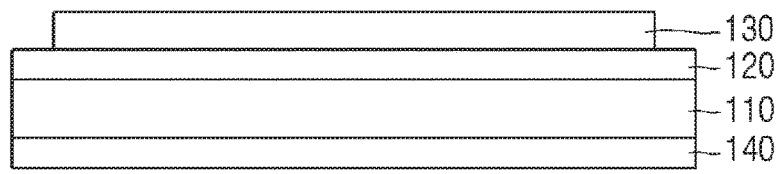

Referring to FIG. 5, a second dielectric layer 140 may be formed on the second side of the substrate 110 opposite to the first side of the substrate 110 on which the first dielectric layer 120 is disposed.

The second dielectric layer 140 may be a silicon nitride layer including silicon nitride. However, inventive concepts are not limited thereto. That is, in some example embodiments, the second dielectric layer 140 may include any one of silicon oxide, metal, metal oxide and metal nitride. In a subsequent process, the second dielectric layer 140 may be used as a mask layer.

Figure 6:
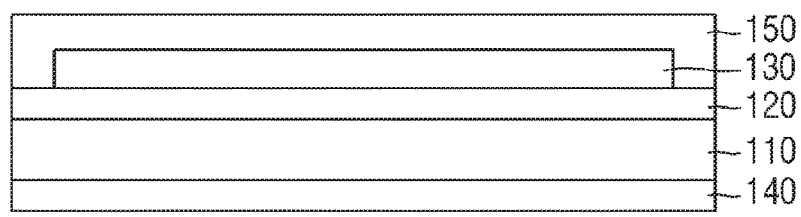

Referring to FIG. 6, a protective layer 150 may be formed on the first dielectric layer 120 exposed to the side surface of the amorphous carbon layer 130 and the amorphous carbon layer 130 so as to cover the amorphous carbon layer 130.

The protective layer 150 may include, for example, silicon oxide. However, inventive concepts are not limited thereto. That is, in some example embodiments, the protective layer 150 may include any one of silicon nitride, metal, metal oxide and metal nitride.

Figure 7:
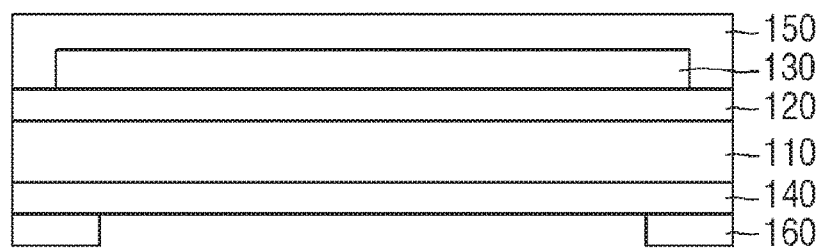

Referring to FIG. 7, a photoresist pattern 160 may be formed on the second dielectric layer 140. Since the photoresist pattern 160 is a process for forming the support 170 through a process to be described later, the photoresist pattern 160 may be formed on the edge of the substrate 110. However, inventive concepts are not limited thereto.

Figure 8:
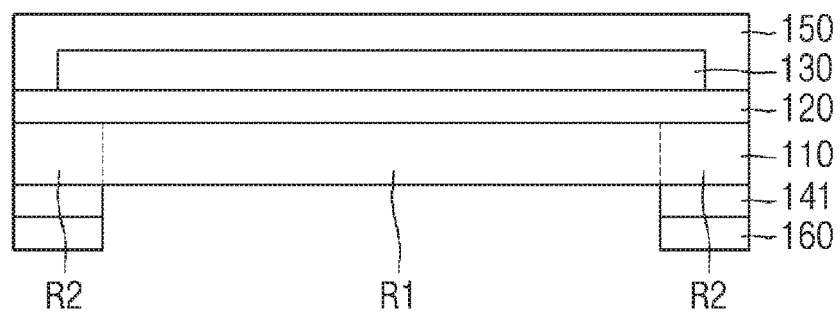

Referring to FIG. 8, the second dielectric layer 140 may be etched using the photoresist pattern 160. In this case, the second dielectric layer 140 may be dry etched. However, inventive concepts are not limited thereto.

When the second dielectric layer 140 is etched, the second dielectric layer 140 formed on the first region R1 of the substrate 110 may be etched.

For example, the photoresist pattern 160 may be formed on the second dielectric layer 140 so that the second dielectric layer 140 formed on the first region R1 of the substrate 110 may be etched, and the mask pattern 141 may be formed, by etching the second dielectric layer 140 formed on the first region R1 of the substrate 110 using the photoresist pattern 160.

Figure 9:
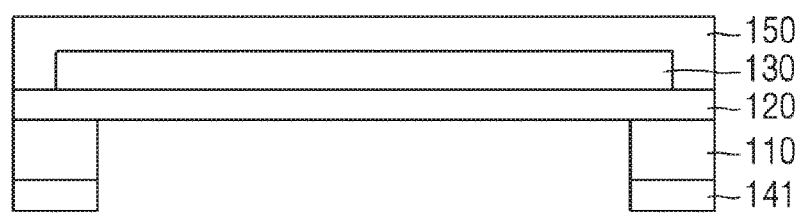

Referring to FIG. 9, the first region R1 of the substrate 110 may be etched using the mask pattern 141. In this case, the first region R1 of the substrate 110 may be wet-etched using KOH. However, inventive concepts are not limited thereto.

When the first region R1 of the substrate 110 is wet-etched by KOH, the protective layer 150 may limit and/or prevent the amorphous carbon layer 130 from being wet-etched with KOH.

Figure 10:
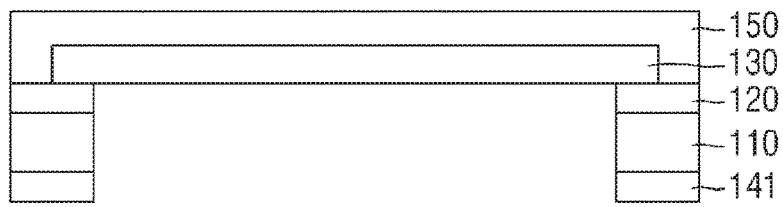

Referring to FIG. 10, the mask pattern 141 may be used to etch the first dielectric layer 120 which has been formed on the first region R1 of the substrate 110 before the first region R1 of the substrate 110 is etched. In this case, the first dielectric layer 120 may be wet-etched by one of buffered oxide etcher (BOE) or hydrogen fluoride (HF). Further, the first dielectric layer 120 may also be vapor-etched by one of buffered oxide etcher (HOE) or hydrogen fluoride (HF). However, inventive concepts are not limited thereto.

Figure 11:

Referring to FIG. 11, the protective layer 150 may be removed to expose the amorphous carbon layer 130.

Subsequently, referring to FIG. 12, an adhesive layer 180 may be formed on the mask pattern 141.

The adhesive layer 180 may include, for example, at least one organic resin of an epoxy resin, an acrylic resin, a polyester resin or a polycarbonate resin.

By including the organic resin, the adhesive layer 180 may bond the support 170 to the reticle 2.

Through the aforementioned processes, the support 170 including a part of the first non-etched (or remaining) dielectric layer 120, the second region R2 of the substrate 110, the mask pattern 141 and the adhesive layer 180 may be formed.

As a result, the pellicle 100 including the amorphous carbon layer 130 and the support 170 is completed.

Figure 13:
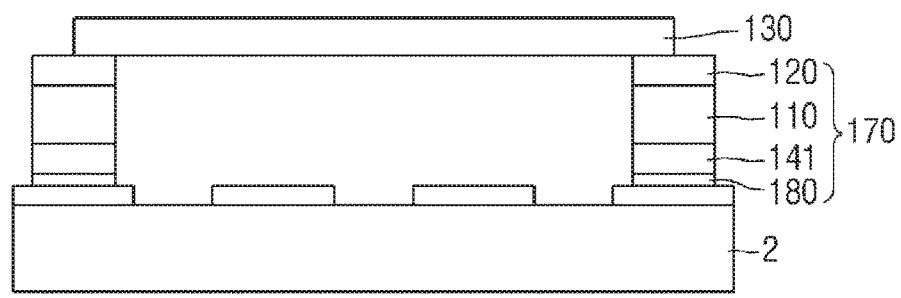

Referring to FIG. 13, the completed pellicle 100 may be attached onto the reticle 2. For example, the pellicle 100 may be attached to one side of the reticle 2 on which the optical pattern is formed, using the adhesive layer 180.

A method for fabricating the semiconductor device according to some example embodiments may include providing a pellicle layer having higher EUV permeability and heat resistance and improved durability, using the amorphous carbon layer 130 having a mixed structure of the $sp^2$ carbon bond structure and the $sp^3$ carbon bond structure, as compared with a single crystal silicon layer.

Further, unlike a conventional amorphous carbon layer 130, which is attached to a substrate 110 via the peeling process, since the substrate 110 and the amorphous carbon layer 130 are formed integrally and the support 170 is formed by the substrate 110, a method for fabricating the semiconductor device according to some example embodiments may omit the peeling process of the amorphous carbon layer 130. As a result, it is possible to reduce the process defects due to residues which may be generated in the peeling process of the amorphous carbon layer 130.

Hereinafter, a method for fabricating a semiconductor device according to some example embodiments will be described with reference to FIG. 14. Differences from the method for fabricating the semiconductor device discussed with reference to FIG. 3 to FIG. 13 will be mainly described.

Figure 14:
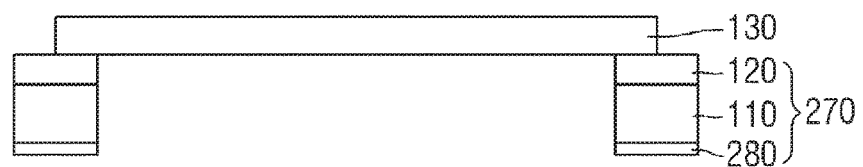
FIG. 14 is an intermediate stage diagram for explaining a method for fabricating a semiconductor device according to some example embodiments.

FIG. 14 is an intermediate stage diagram for explaining a method for fabricating a semiconductor device according to some example embodiments.

Figure 12:
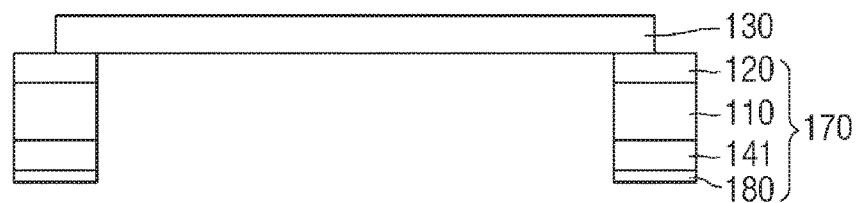

Referring to FIG. 14, unlike the fabricating process illustrated in FIG. 12 according to some example embodiments, after the fabricating process illustrated in FIG. 11, that is, after removing the protective layer 150 formed on the amorphous carbon layer 130, the mask pattern 141 formed on the second side of the substrate 110 may be removed.

However, in some example embodiments, after removing the mask pattern 141 formed on the second side of the substrate 110, the protective layer 150 formed on the amorphous carbon layer 130 may be removed.

Subsequently, an adhesive layer 280 may be formed on the second side of the substrate 110 from which the mask pattern 141 is removed. This makes it possible to form a support 270 including a part of the non-etched (or remaining) first dielectric layer 120, the second region R2 of the substrate 110, and the adhesive layer 280.

Hereinafter, a method for fabricating a semiconductor device according to some example embodiments will be described with reference to FIG. 15. Differences from the methods for fabricating the semiconductor device according to the example embodiments illustrated in FIG. 3 to FIG. 13 will be mainly described.

Figure 15:
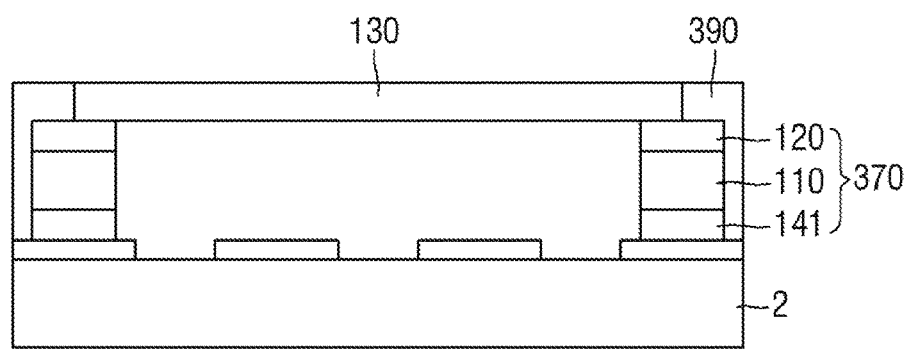
FIG. 15 is an intermediate stage diagram for explaining a method for fabricating a semiconductor device according to some example embodiments.

FIG. 15 is an intermediate stage diagram for explaining a method for fabricating a semiconductor device according to some example embodiments.

Referring to FIG. 15, unlike the fabricating process illustrated in FIG. 12 according to some example embodiments, after the fabricating process illustrated in FIG. 11, that is, after removing the protective layer 150 formed on the amorphous carbon layer 130, no adhesive layer may be formed on the mask pattern 141.

As a result, it is possible to form a support 370 including a part of the non-etched (or remaining) first dielectric layer 120, the second region R2 of the substrate 110, and the mask pattern 141.

The pellicle including the amorphous carbon layer 130 and the support 370 may be attached to the reticle 2, by a fixing part 390 installed on the reticle 2.

For example, the pellicle may be attached to the reticle 2, by utilizing the fixing part 390 provided on the edge of the reticle 2 or the upper surface of the edge in a hinge shape.

However, inventive concepts are not limited thereto. That is, in some example embodiments, the fixing part 390 may be installed on the reticle 2 in a shape other than the hinge shape. In some example embodiments, the fixing part 390 may be installed at the edge of the pellicle in a hinge shape, and may be attached to the pellicle and the reticle 2.

By attaching the pellicle to the reticle 2 using the fixing part 390, it is possible to limit and/or prevent the contamination of the optical pattern formed on one side of the reticle 2, due to the adhesive layer.

In addition, since there is no residue of the adhesive layer on one side of the reticle 2, it is possible to easily store the reticle 2, which is an expensive device.

Hereinafter, FIG. 16 to FIG. 20 illustrate a method for fabricating a semiconductor device according to some example embodiments. Differences from the method for fabricating the semiconductor device according discussed with reference to FIG. 3 to FIG. 13 will be mainly described.

FIG. 16 to FIG. 20 are intermediate stage diagrams for explaining a method for fabricating a semiconductor device according to some example embodiments.

Figure 16:
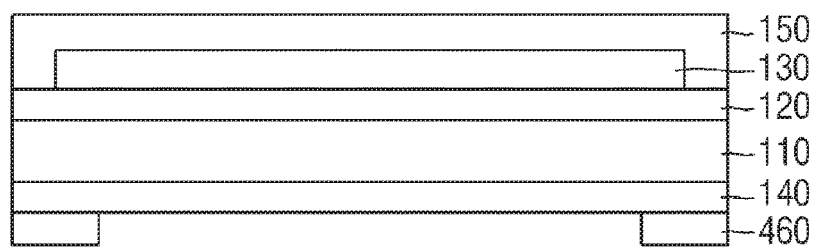
FIG. 16 to FIG. 20 are intermediate stage diagrams for explaining a method for fabricating a semiconductor device according to some example embodiments.

Referring to FIG. 16, unlike the fabricating process illustrated in FIG. 7 according to some example embodiments, the fabricating process illustrated in FIG. 6, that is, after the fabricating process illustrated in FIG. 6 that is, after the protective layer 150 is formed on the first dielectric layer 120 and the amorphous carbon layer 130 to cover the amorphous carbon layer 130, a photoresist pattern 460 may be formed on the second dielectric layer 140.

In this case, the width of the photoresist pattern 460 may be smaller than the width of the photoresist pattern 160 illustrated in FIG. 7 in consideration of an inclination profile of the side surface of the non-etched (or remaining) substrate 110 to be described later. However, inventive concepts are not limited thereto.

Figure 17:
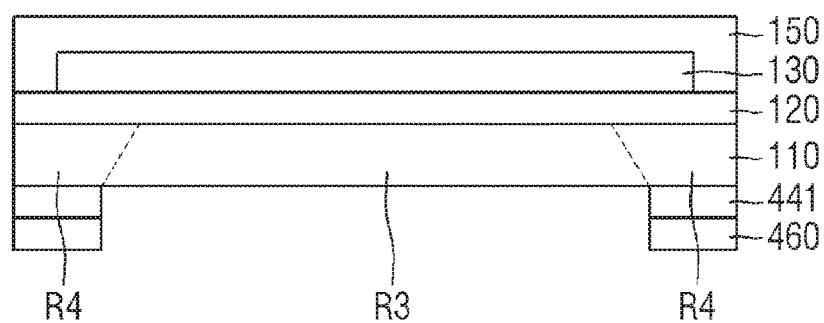

Referring to FIG. 17, the second dielectric layer 140 may be etched using the photoresist pattern 460. In this case, the second dielectric layer 140 may be dry-etched. However, inventive concepts are not limited thereto.

When the second dielectric layer 140 is etched, the second dielectric layer 140 formed on the third region R3 of the substrate 110 may be etched.

For example, the photoresist pattern 460 may be formed on the second dielectric layer 140 such that the second dielectric layer 140 formed on the third region R3 of the substrate 110 can be etched, and a mask pattern 441 may be formed, by etching the second dielectric layer 140 formed on the third region R3 of the substrate 110, using the photoresist pattern 460.

Figure 18:
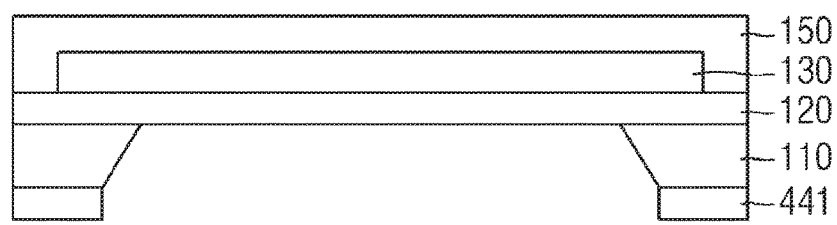

Referring to FIG. 18, the third region R3 of the substrate 110 may be anisotropically etched, using the mask pattern 441.

As a result, as illustrated in FIG. 18, the side surface of the fourth region R4 of the non-etched (or remaining) substrate 110 may have an inclination profile in which the width increases toward the first dielectric layer 120. That is, an interval between the fourth regions R4 of the non-etched (or remaining) substrate 110 may decrease toward the first dielectric layer 120.

Figure 19:
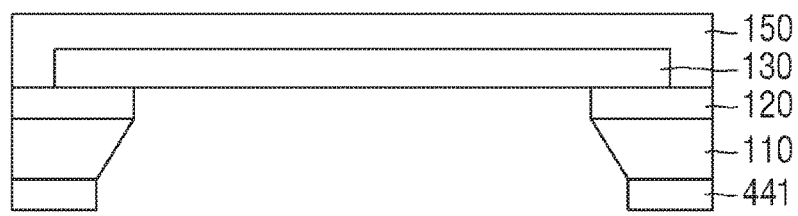

Referring to FIG. 19, the first dielectric layer 120 may be isotropically etched, using the fourth region R4 of the non-etched (or remaining) substrate 110 as a mask. However, inventive concepts are not limited thereto. That is, in some example embodiments, the first dielectric layer 120 may also be anisotropically etched.

Figure 20:

Referring to FIG. 20, the protective layer 150 may be removed to expose the amorphous carbon layer 130. Subsequently, by forming the adhesive layer 480 on the mask pattern 441, the pellicle may be completed.

Through the aforementioned processes, it is possible to form the support 470 including a part of the non-etched (or remaining) first dielectric layer 120, the fourth region R4 of the substrate 110, the mask pattern 441, and the adhesive layer 480.

In this way, it is possible to form a pellicle including the amorphous carbon layer 130 and the support 470 having the side surface of the inclination profile.

While some example embodiments of inventive concepts have been described, those of ordinary skill in the art would appreciate that various changes in form and detail may be made therein without departing from the spirit and scope of inventive concepts as defined by the following claims. The example embodiments described herein should be considered in a descriptive sense only and not for purposes of limitation.

What is claimed is:

1. A method for fabricating a semiconductor device, the method comprising:
forming a pellicle including an amorphous carbon layer, the forming the pellicle including,
forming a first dielectric layer on a first side of a substrate that includes a first region and second regions at both sides of the first region, the first dielectric layer directly contacting the first side of the substrate,
forming the amorphous carbon layer on the first dielectric layer, the amorphous carbon layer directly contacting the first dielectric layer,
forming a second dielectric layer on a second side of the substrate opposite the first side of the substrate, etching the second dielectric layer overlapping the first region of the substrate to form a mask pattern, and etching the first region of the substrate and the first dielectric layer on the first region of the substrate using the mask pattern to form a support including the second region of the substrate and a remaining part of the first dielectric layer;

attaching the pellicle onto a reticle; and forming a photoresist pattern using extreme ultraviolet (EUV) light, the forming the photoresist pattern including transmitting the EUV light through the pellicle and reflecting the EUV light using the reticle.

2. The method of claim 1, wherein the etching the first region of the substrate and the first dielectric layer on the first region of the substrate using the mask pattern to form the support includes:

wet-etching the first region of the substrate with KOH using the mask pattern, and wet-etching or vapor-etching the first dielectric layer on the first region of the substrate with a buffered oxide etch (BOE) process or hydrogen fluoride (HF).

3. The method of claim 2, wherein
the first dielectric layer includes silicon oxide, and
the second dielectric layer includes silicon nitride.

4. The method of claim 1, wherein the etching the first region of the substrate and the first dielectric layer on the first region of the substrate using the mask pattern to form the support includes:

anisotropically etching the first region of the substrate using the mask pattern, and isotropically etching the first dielectric layer on the first region of the substrate.

5. The method of claim 4, wherein an interval between the second regions of the substrate becomes smaller as a distance from the first dielectric layer decreases.

6. The method of claim 1, further comprising:
forming a protective layer that covers the amorphous carbon layer after the forming the second dielectric layer on the second side of the substrate.

7. The method of claim 6, wherein the protective layer includes silicon oxide.

8. The method of claim 1, wherein the attaching the pellicle onto the reticle includes attaching the pellicle onto the reticle using a fixing part installed in the reticle.

9. The method of claim 1, wherein the etching the first region of the substrate and the first dielectric layer on the first region of the substrate using the mask pattern to form the support further includes removing the mask pattern after etching the first region of the substrate and the first dielectric layer formed on the first region of the substrate, and forming an adhesive layer on the remaining part of the first dielectric layer.

10. The method of claim 1, wherein the etching the first region of the substrate and the first dielectric layer on the first region of the substrate using the mask pattern to form the support further includes forming an adhesive layer on the mask pattern.

11. A method for fabricating a semiconductor device, the method comprising:

forming a pellicle including an amorphous carbon layer, the forming the pellicle including, forming a first silicon oxide layer on a first side of a silicon substrate, the first silicon oxide layer directly contacting the first side of the silicon substrate, forming the amorphous carbon layer on the first silicon oxide layer, the amorphous carbon layer directly contacting the first silicon oxide layer, forming a silicon nitride layer on a second side of the silicon substrate opposite the first side of the silicon substrate, forming a second silicon oxide layer that covers the amorphous carbon layer, forming a second photoresist pattern on the silicon nitride layer, dry-etching the silicon nitride layer using the second photoresist pattern to form a mask pattern, wet-etching the silicon substrate and the first silicon oxide layer using the mask pattern to form a support including a remaining portion of the silicon substrate and a remaining portion of the first silicon oxide layer, and removing the second silicon oxide layer;

attaching the pellicle onto a reticle; and forming a first photoresist pattern using extreme ultraviolet (EUV) light, the forming the first photoresist pattern including transmitting the EUV light through the pellicle and reflecting the EUV light using the reticle.

12. The method of claim 11, wherein wet-etching the silicon substrate and the first silicon oxide layer using the mask pattern to form the support includes wet-etching the silicon substrate with KOH using the mask pattern, and wet-etching or vapor-etching the first silicon oxide layer with a buffered oxide etch (BOE) process or hydrogen fluoride (HF).

13. The method of claim 11, wherein a width of the silicon substrate increases toward the first silicon oxide layer.

14. The method of claim 11, wherein the forming the amorphous carbon layer on the first silicon oxide layer includes one of plasma-enhanced chemical vapor deposition (PECVD) process, a physical vapor deposition (PVD) process, an atomic layer deposition (ALD) process, and a thermal chemical vapor deposition (thermal-CVD) process.

15. The method of claim 11, wherein the amorphous carbon layer includes a $sp^2$ carbon bond and a $sp^3$ carbon bond.

16. A method for fabricating a pellicle, the method comprising forming a protective layer over an amorphous carbon layer of a stacked structure, the stacked structure including the amorphous carbon layer on a first surface of a substrate and a first dielectric layer between the amorphous carbon layer and the substrate, the amorphous carbon layer covering a first region and a second region of the substrate; and removing the first region of the substrate such that the amorphous carbon layer is connected to a remaining portion of the substrate that includes a second region of the substrate, wherein the first dielectric layer directly contacts the first surface of the substrate, and wherein the amorphous carbon layer directly contacts the first dielectric layer.

17. A method of fabricating a mask assembly, comprising:
forming the pellicle using the method of claim 16;
attaching a reticle to the pellicle.

18. A method of fabricating a semiconductor device, comprising:

forming the pellicle using the method of claim 16;
attaching a reticle to the pellicle; and
forming a photoresist pattern using extreme ultraviolet (EUV) light, the forming the photoresist pattern including transmitting the EUV light through the pellicle and reflecting the EUV light using the reticle.

19. The method of claim 16, further comprising:
forming the amorphous carbon layer on the first dielectric layer before the forming the protective layer over the amorphous carbon layer of the stacked structure, wherein the forming the amorphous carbon layer includes one of PECVD process, a PVD process, an ALD process, and a thermal-CVD process, the amorphous carbon layer includes a $sp^2$ carbon bond and a $sp^3$ carbon bond, and the forming the amorphous carbon layer on the first dielectric layer is performed at a temperature in a range of 400° C. to 500° C.

20. The method of claim 16, further comprising:

forming a support, wherein the forming the support includes etching a portion of the first dielectric layer exposed by the second region of the substrate, the support includes the amorphous carbon layer on a remaining part of the first dielectric layer and the remaining portion of the substrate, and the amorphous carbon layer includes a $sp^2$ carbon bond and a $sp^3$ carbon bond.

* * * * *

UNITED STATES PATENT AND TRADEMARK OFFICE
CERTIFICATE OF CORRECTION

PATENT NO. : 10,345,698 B2
APPLICATION NO. : 15/606170
DATED : July 9, 2019
INVENTOR(S) : Ji Beom Yoo et al.

Page 1 of 1

It is certified that error appears in the above-identified patent and that said Letters Patent is hereby corrected as shown below:

On the Title Page

In item (73) the Assignee information should read as follows:
(73) Assignees: Samsung Electronics Co., Ltd., Gyeonggi-do (KR); Research & Business Foundation Sungkyunkwan University, Gyeonggi-do (KR)

Signed and Sealed this
Tenth Day of September, 2019

Andrei Iancu
*Director of the United States Patent and Trademark Office*